(12) United States Patent
Glass et al.

(10) Patent No.: US 10,535,735 B2
(45) Date of Patent: Jan. 14, 2020

(54) CONTACT RESISTANCE REDUCED P-MOS TRANSISTORS EMPLOYING GE-RICH CONTACT LAYER

(75) Inventors: Glenn A. Glass, Beaverton, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/539,200

(22) Filed: Jun. 29, 2012

(65) Prior Publication Data
US 2014/0001520 A1 Jan. 2, 2014

(51) Int. Cl.
*H01L 29/775* (2006.01)
*H01L 29/167* (2006.01)
*H01L 29/10* (2006.01)

(52) U.S. Cl.
CPC .................. *H01L 29/1033* (2013.01)

(58) Field of Classification Search
CPC .................. H01L 29/78; H01L 21/336
USPC ........... 257/288, E29.255, E21.409; 438/268
See application file for complete search history.

(56) References Cited

U.S. PATENT DOCUMENTS

| | | | | |
|---|---|---|---|---|
| 5,698,869 | A * | 12/1997 | Yoshimi | H01L 27/1203 257/192 |
| 6,376,340 | B1 * | 4/2002 | Sato et al. | 438/488 |
| 6,664,145 | B1 * | 12/2003 | Yamazaki | H01L 29/42384 257/E27.111 |
| 2007/0096194 | A1 * | 5/2007 | Streck et al. | 257/315 |
| 2007/0235802 | A1 * | 10/2007 | Chong et al. | 257/346 |
| 2008/0124878 | A1 * | 5/2008 | Cook et al. | 438/300 |
| 2009/0246922 | A1 * | 10/2009 | Wu et al. | 438/231 |
| 2010/0035400 | A1 * | 2/2010 | Zhu et al. | 438/300 |
| 2010/0148217 | A1 * | 6/2010 | Simonelli | H01L 21/02381 257/192 |
| 2010/0301350 | A1 * | 12/2010 | Tamura et al. | 257/77 |
| 2011/0254052 | A1 * | 10/2011 | Kouvetakis et al. | 257/190 |
| 2012/0032275 | A1 * | 2/2012 | Haran et al. | 257/401 |
| 2012/0146149 | A1 * | 6/2012 | Momiyama | H01L 21/82387 257/351 |

(Continued)

OTHER PUBLICATIONS

Xie et al. "Synthesis, Stability Range, and Fundamental Properties of Si—Ge—Sn Semiconductors Grown Directly on Si(100) and Ge(100) Platforms" Published on May 27, 2010 Chemistry of Materials, vol. 22, No. 12, 2010 pp. 3779-3789.*

*Primary Examiner* — Joseph C. Nicely
*Assistant Examiner* — Lamont B Koo
(74) *Attorney, Agent, or Firm* — Schwabe, Williamson & Wyatt P.C.

(57) ABSTRACT

Techniques are disclosed for forming transistor devices having reduced parasitic contact resistance relative to conventional devices. The techniques can be implemented, for example, using a standard contact stack such as a series of metals on, for example, silicon or silicon germanium (SiGe) source/drain regions. In accordance with one example such embodiment, an intermediate boron-doped germanium-tin alloy layer is provided between the source/drain and contact metals to significantly reduce contact resistance. Numerous transistor configurations and suitable fabrication processes will be apparent in light of this disclosure, including both planar and non-planar transistor structures (e.g., FinFETs and nanowire transistors). The techniques are particularly well-suited for implementing p-type devices, but can be used for n-type devices if so desired.

24 Claims, 15 Drawing Sheets

(56) References Cited

U.S. PATENT DOCUMENTS

2012/0318334 A1* 12/2012 Bedell et al. ................. 136/255
2013/0113042 A1*  5/2013 Wang et al. .................. 257/347
2013/0285153 A1* 10/2013 Lee ................... H01L 21/02532
                                                    257/369

* cited by examiner

CONTACT RESISTANCE REDUCED P-MOS TRANSISTORS EMPLOYING GE-RICH CONTACT LAYER

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of, metal oxide semiconductor (MOS) transistor semiconductor devices, such as those used in a complementary metal oxide semiconductor (CMOS), it is often desired to minimize the parasitic resistance associated with contacts otherwise known as external resistance $R_{ext}$. Decreased $R_{ext}$ enables higher current from an equal transistor design

DETAILED DESCRIPTION

Figure 1A:
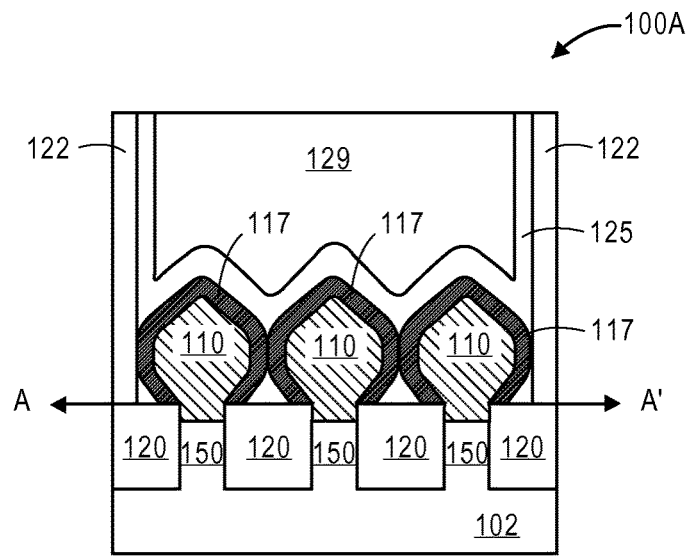
FIGS. 1A-1C illustrate cross-sectional views of a MOS device having a boron-doped GeSn alloy layer between the source/drain and the source/drain contact, in accordance with an embodiment of the invention.

Transistor structures having a boron-doped germanium-tin alloy layer and methods for forming such transistors are described. Embodiments of the present invention have been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure the present invention. Additionally, the various embodiments shown in the figures are illustrative representations and are not necessarily drawn to scale.

Techniques are disclosed for forming transistor devices having reduced parasitic contact resistance relative to conventional devices. The techniques can be implemented, for example, using a standard contact stack such as a series of metals on silicon or silicon germanium (SiGe) source/drain regions. In accordance with one example embodiment, an intermediate boron-doped germanium-tin alloy layer is provided between the source/drain and source/drain contact to significantly reduce contact resistance. Numerous transistor configurations and suitable fabrication processes will be apparent in light of this disclosure, including both planar and non-planar transistor structures (e.g., FinFETs and nanowire-based devices). The techniques are particularly well-suited for implementing p-type devices, but can be used for n-type devices if so desired.

As previously explained, increased drive current in the transistors can be achieved by reducing device resistance. Contact resistance is one component of a device's overall resistance. A standard transistor contact stack typically includes, for example, a silicon or SiGe source/drain layer, a nickel silicide layer, a titanium nitride adhesion layer, and a tungsten contact/plug. In such configurations, the contact resistance is effectively limited by the silicon, Ge or SiGe valence band alignment to the pinning level in the metal. Typically, using industry standard silicides such as nickel (or other suitable silicides, such as titanium, cobalt, or platinum), this results in a band misalignment of about 0.5 eV. Thus, and in accordance with an example embodiment of the present invention, a boron-doped germanium-tin alloy layer is provided between the source/drain and contact metals to significantly reduce the band misalignment value and contact resistance.

In one specific example embodiment, contacts configured with the boron-doped germanium-tin alloy layer exhibit a reduction in the band misalignment value to near zero and a corresponding reduction in contact resistance of about 3-5× relative to a conventional contact stack similarly configured, but without the boron-doped germanium-tin alloy layer between the source/drain regions and contact metal.

The bandgap for GeSn alloys starts at 0.66 eV for pure Ge, and becomes metallic (no bandgap) for high tin concentrations (approximately 30 atomic % Sn). While the conduction band remains roughly fixed, the valence band increases in energy towards that of the conduction band as more tin is added to the boron-doped GeSn alloy. This enables tailoring of the band alignment between the GeSn alloy and the metal contact layer, which can create a near-zero energy barrier at the GeSn/contact metal interface. A low energy barrier, coupled with a relatively thin boron-doped GeSn alloy layer enables further reduction of the contact resistance over that which is possible using a boron-doped Ge layer without tin at the interface of the source/drain and the source/drain contact. Thus, transistor structures configured in accordance with embodiments of the present invention provide an improvement over prior and conventional structures with respect to lower contact resistance.

Numerous transistor configurations and suitable fabrication processes will be apparent in light of this disclosure, including both planar and non-planar transistor structures (e.g., such as double-gate, trigate, and nanowire transistor structures). Any number of such structural features and material systems can be used in conjunction with a germanium-tin alloy layer as described herein. The transistor structure may include p-type source/drain regions or n-type source/drain regions. In some example embodiments, the transistor structure includes dopant-implanted source/drain regions or epitaxial (or poly) replacement source/drain regions of silicon, SiGe alloys, or nominally pure germanium films (e.g., such as those with less than 10% silicon) in a MOS structure. In any such implementations, a boron-doped germanium-tin alloy layer can be formed directly over the source/drain regions, in accordance with an embodiment of the present invention. A contact metal (or series of metals) can then be deposited and a subsequent reaction (annealing) may optionally be carried out to form metal germanide/silicide source and drain contacts. As will be appreciated, the contact may be implemented as a stack including one or more of a germanide/silicide layer, an adhesion layer, and/or a metal plug layer.

In other example embodiments, an optional thin buffer with graded germanium concentration, graded tin concentration, and/or graded boron concentration can be used as an interfacial layer between the source/drain layer and the boron-doped germanium-tin alloy layer. In still other embodiments, the boron-doped germanium-tin alloy layer or source/drain layer themselves can have a graded germanium, tin, and/or boron concentration in a similar fashion as to the optional buffer.

As is known, a FinFET is a transistor built around a thin strip of semiconductor material generally referred to as the fin. The transistor includes the standard field effect transistor (FET) nodes, including a gate, a gate dielectric, a source region, and a drain region. The conductive channel of the device resides on the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as double-gate FinFETs, in which the conductive channel principally resides only along the two sidewalls of the fin (and not along the top of the fin).

Figure 3A:
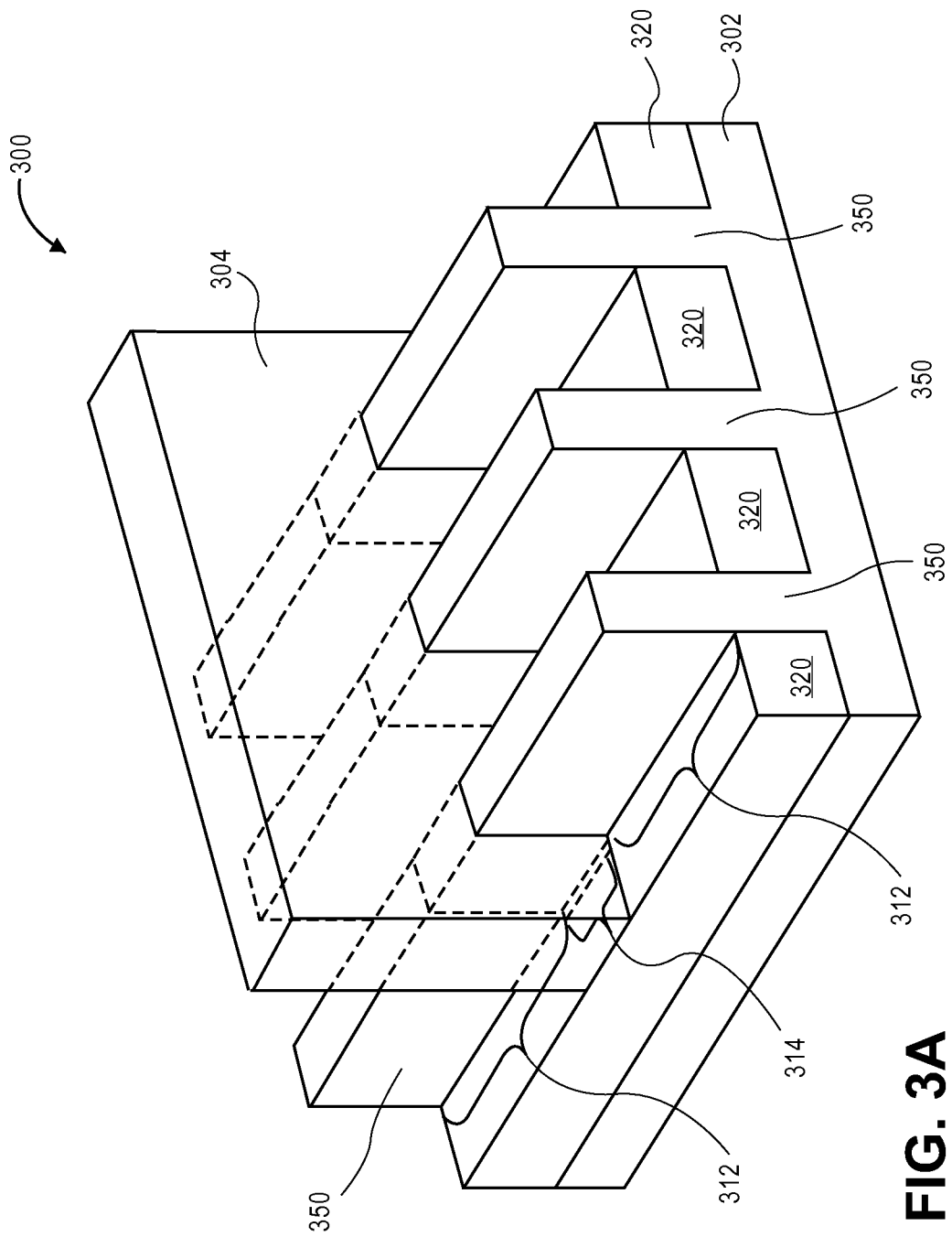
FIGS. 3A-3I illustrate isometric views of a method for forming a fin-based MOS device having a boron-doped GeSn alloy layer between the source/drain and the source/drain contact, in accordance with an embodiment of the invention.

FIG. 1A shows a cross-sectional view of a source/drain region of an example finFET architecture, configured to have a boron-doped germanium-tin alloy layer between the source/drain and the source/drain contact, in accordance with an embodiment of the invention. An isometric view of the example finFET architecture embodiment is shown in FIG. 3I, with the cross-sectional plane of FIG. 1A taken along line A-A' through one of a pair of source/drain regions of the device. Referring to FIG. 1A, the source/drain region of the finFET device 100A includes a substrate 102 having a semiconductor body or fin 150 extending from the substrate 102 through shallow trench isolation (STI) regions 120, according to an embodiment of the invention. In an embodiment, source/drain layers 110 are formed on the top surface of fins 150. In an embodiment, a boron-doped germanium-tin alloy layer 117 is disposed between source/drain layer 110 and a source/drain contact stack. The source/drain contact stack may comprise contact metal 125, an adhesion layer (not shown), and metal plug 129. In an embodiment, interlayer dielectric 122 surrounds the source/drain region.

The source/drain layers 110 may have any number of configurations. In the embodiment illustrated in FIG. 1A, for instance, epitaxially grown source/drain layers 110 are formed on the top surface of fins 150, which have been etched below the surface of STI regions 120. Source/drain layers 110 may be silicon, germanium, or silicon germanium (e.g., with a germanium concentration in the range of, for instance, 10 to 70 atomic %). In another embodiment, fins 150 are not etched, but extend well above the surface of the STI region, and have been implanted with dopants to form p-type or n-type source/drain regions as required by the transistor design. In an embodiment, the boron-doped germanium-tin alloy layer 117 may be formed directly on fins 150.

Boron-doped germanium-tin alloy layer 117 is generally disposed between the source/drain layers 110 and contact metal 125. The thickness of alloy layer 117 can vary from one embodiment to the next, but in one example embodiment is in the range of 10 to 500 Angstroms (Å). The germanium and tin concentrations in alloy layer 117 may vary depending on the transistor design and the materials used for contact metal 125 and source/drain layer 110. As explained above, the tin concentration may be adjusted to tailor the valence band of the alloy layer 117 in order to minimize the energy barrier at the interface with the contact metal 125. For example, in an embodiment the tin concentration in alloy layer 117 is up to 30 atomic % Sn, while the germanium concentration is greater than 70 atomic % Ge. In another embodiment, the tin concentration is up to 15 atomic % Sn and the germanium concentration is greater than 80% Ge. The boron concentration of alloy layer 117 can also vary, for example from 1E19 $cm^{-3}$ to 5E21 $cm^{-3}$. In addition to or in lieu of boron, alloy layer 117 may also be doped with other p-type dopants, such as Al, Ga, or In. In addition, alloy layer 117 may contain up to 10 atomic % silicon. Preferably, GeSn alloy layer 117 contains less than 5% Si.

Boron-doped germanium-tin alloy layer 117 may be polycrystalline or monocrystalline. In an embodiment, the tin is substitutionally incorporated into the germanium diamond-cubic lattice sites. In addition, alloy layer 117 may be strained or unstrained. Generally, the presence of stacking faults, grain boundaries, misfit dislocations, etc. does not impair the performance of the boron-doped GeSn alloy layer 117.

The source/drain contact stack may comprise conventional structure and materials, for example, contact metal layer 125, an adhesion layer (not shown), and contact plug 129. In an embodiment, contact metal 125 lines the contact trench, in contact with alloy layer 117 on source/drain layers 110. Contact metal 125 may be any suitable contact metal, for example, Ti, Ni, Co, and Pt. In an embodiment, contact metal layer 125 comprises a metal silicide or metal germanide. In an embodiment, contact plug 129 fills the contact trench lined by contact metal 125. One example source/drain contact stack comprises a nickel silicide contact metal layer 125, a titanium nitride adhesion layer, and a tungsten plug 129, although any number of contact metal configurations can be used as will be appreciated in light of this disclosure.

In another embodiment, a buffer layer (not shown) is provided between the source/drain layer 110 and the boron-doped germanium-tin alloy layer 117. In one such embodiment, the source/drain layer 110 is a boron doped SiGe layer having a fixed concentration of germanium (e.g., in the range of 30 to 70 atomic %) and the buffer layer can be a thin SiGe layer (e.g., 30 to 120 Å, such as 50 to 100 Å) having a germanium concentration graded from a base level concentration compatible with the underlying boron doped SiGe layer up to 100 atomic % Ge (or near 100 atomic %, such as in excess of 90 atomic % or 95 atomic % or 98 atomic % Ge). In addition, the buffer layer may have a tin concentration that is either fixed or, in another embodiment, graded from a base level concentration compatible with the underlying boron-doped SiGe layer up to 15 atomic % tin. In some such cases, the boron concentration within this buffer layer can be fixed at a desired high level or can range, for example, from a base concentration at or otherwise compatible with the underlying SiGe layer up to the desired high concentration (e.g., in excess of 1E19 cm$^{-3}$, 5E20 cm$^{-3}$, or 5E21 cm$^{-3}$).

Alternatively, rather than using a buffer between the source/drain layer 110 and the boron-doped germanium-tin alloy layer 117, the alloy layer 117 itself can be graded in a similar fashion. For example, and in accordance with one example embodiment, the boron-doped GeSn alloy layer 117 can be configured with a germanium concentration graded from a base level concentration compatible with the underlying substrate and/or source/drain regions (e.g., in the range of 30 to 70 atomic %) up to 100 atomic % (or near 100 atomic %). The tin concentration within the alloy layer 117 can be fixed at a desired level or can range, for example, from a base concentration at or otherwise compatible with the underlying substrate and/or source/drain layers up to the desired high level (e.g. up to 15 atomic %). In addition, the boron concentration within this alloy layer 117 layer can be fixed at a desired high level or can range, for example, from a base concentration at or otherwise compatible with the underlying substrate and/or source/drain regions up to the desired high level (e.g., in excess of 1E19 cm$^{-3}$).

Figure 1B:
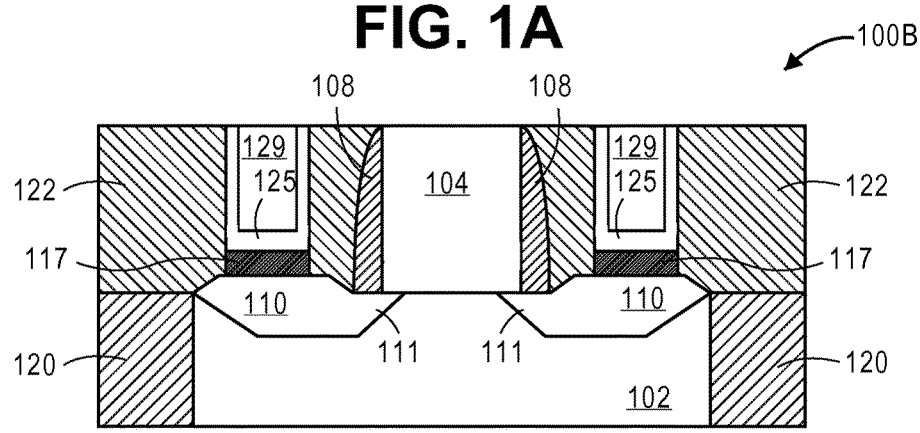

FIG. 1B illustrates a planar MOS device configured with a boron-doped germanium-tin alloy layer between the source/drain and the source/drain contact, in accordance with an embodiment of the present invention. In particular, a boron-doped germanium-tin alloy layer 117 is provided between each source/drain layer 110 and contact metal 125. A gate structure 104 defines a channel region of the transistor 100B between the pair of source/drain regions 110. Sidewall spacers 108 are optionally formed on the sidewalls of the gate structure 104. In an embodiment, STI regions 120 and interlayer dielectric 122 isolate the device components.

As discussed with respect to the fin-based device embodiment, the source/drain layers 110 of planar devices may have a variety of configurations. In this example embodiment, for instance, the source/drain regions 110 are formed by etching the substrate 102 and then epitaxially growing silicon or silicon germanium (e.g., with a germanium concentration in the range of, for instance, 10 to 70 atomic %) within the etched area. In an embodiment, source/drain regions 110 comprise tip regions 111 extending underneath spacers 108. In an embodiment, source/drain regions 110 create strain in the channel region underlying the gate stack, which may increase mobility in the channel. In another embodiment, source/drain layers 110 are formed by doping regions of substrate 102. In another example embodiment, the transistor does not include undercut or tip regions 111.

In FIG. 1B, boron-doped GeSn alloy layer 117 is disposed within a trench in interlayer dielectric 122, between source/drain layer 110 and contact metal layer 125, according to an embodiment of the invention. In another embodiment, boron-doped GeSn alloy layer 117 covers the entire top surface of source/drain layer 110, below the source/drain contact trench. The composition of the boron-doped GeSn alloy layer 117 is dependent on the materials used for the source/drain layers 110 and the contact metal 125, as discussed above with respect to the fin-based embodiment in FIG. 1A. In an embodiment, boron-doped germanium-tin alloy layer 117 is from 10 to 500 Å thick. In an embodiment, a buffer layer (not shown) having graded germanium, tin, and/or boron concentrations is disposed between the source/drain layer 110 and alloy layer 117, as discussed above with respect to FIG. 1A.

The source/drain contact stack, comprising contact metal 125 and contact plug 129, contacts the top surface of boron-doped germanium-tin alloy layer 117 exposed at the bottom of the trench in interlayer dielectric 122, according to an embodiment of the invention. The source/drain contact stack may also contain an adhesion layer between contact metal 125 and contact plug 129, and/or a silicide/germanide within contact metal 125, as discussed previously with respect to the fin-based device embodiment.

Figure 1C:
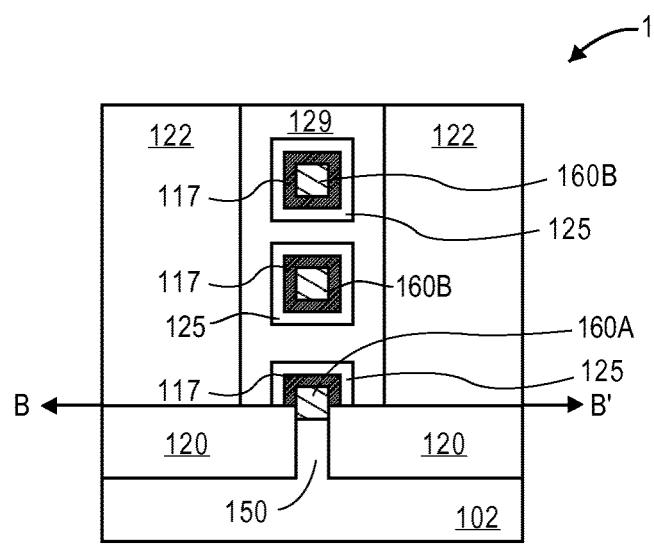

FIG. 1C illustrates a cross-sectional view of the source/drain region of a nanowire-based transistor 100C configured with a boron-doped germanium-tin alloy layer 117 between the source/drain contact and the source/drain portion of nanowires 160A/160B, in accordance with an embodiment of the present invention. An isometric view of the example nanowire-based FET architecture embodiment is shown in FIG. 5D, with the cross-sectional plane of FIG. 1C taken along line B-B' through one of a pair of source/drain regions of the device.

A plurality of nanowires 160A/160B are disposed above substrate 102, according to an embodiment of the invention. In an embodiment, bottommost nanowire 160A is formed on fin 150, which extends through STI regions 120. Boron-doped germanium-tin alloy layer 117 wraps around the full perimeter of the source/drain portions of each of top nanowires 160B, according to an embodiment of the invention. In an embodiment, boron-doped germanium-tin alloy layer 117 covers a portion of the perimeter of the source/drain portion of bottommost nanowire 160B. In another embodiment, alloy layer 117 wraps around the full perimeter of bottommost nanowire 160B. Nanowires 160A/160B may be, for example, Si, SiGe, or Ge. The composition of the boron-doped GeSn alloy layer 117 is dependent on the materials used for nanowires 160A/160B and the contact metal 125, as discussed above with respect to the fin-based embodiment in FIG. 1A. Boron-doped germanium-tin alloy layer 117 is from 10 to 500 Å thick. In an embodiment, nanowire FET 100C additionally comprises a graded buffer layer (not shown) between nanowires 160A/160B and boron-doped germanium-tin alloy layer 117, as discussed above with respect to the fin-based embodiment.

In an embodiment, the source/drain contact structure is formed in a trench in interlayer dielectric 122, wrapping around alloy layer 117 on top nanowires 160B, and covering alloy layer 117 on a portion of the perimeter of bottommost nanowire 160A. In another embodiment, the source/drain contact structure wraps around the full perimeter of bottommost nanowire 160A. In an embodiment, the source/drain contact comprises contact metal layer 125 formed over alloy layer 117, an adhesion layer (not shown) formed over contact metal layer 125, and a metal plug 129 in contact with the adhesion layer and filling the contact trench. Boron-doped germanium-tin alloy layer 117 reduces the contact resistance between the source/drain portions of nanowires 160A/160B and contact metal layer 125.

Thus, a low contact resistance architecture for numerous transistor devices is provided. The techniques provided herein can be applied, for example, to benefit any technology nodes (e.g., 90 nm, 65 nm, 45 nm, 32 nm, 22 nm, 14 nm, and 10 nm transistors, and lower), and the claimed invention is not intended to be limited to any particular such nodes or range of device geometries. Other advantages will be apparent in light of this disclosure.

Figure 2:
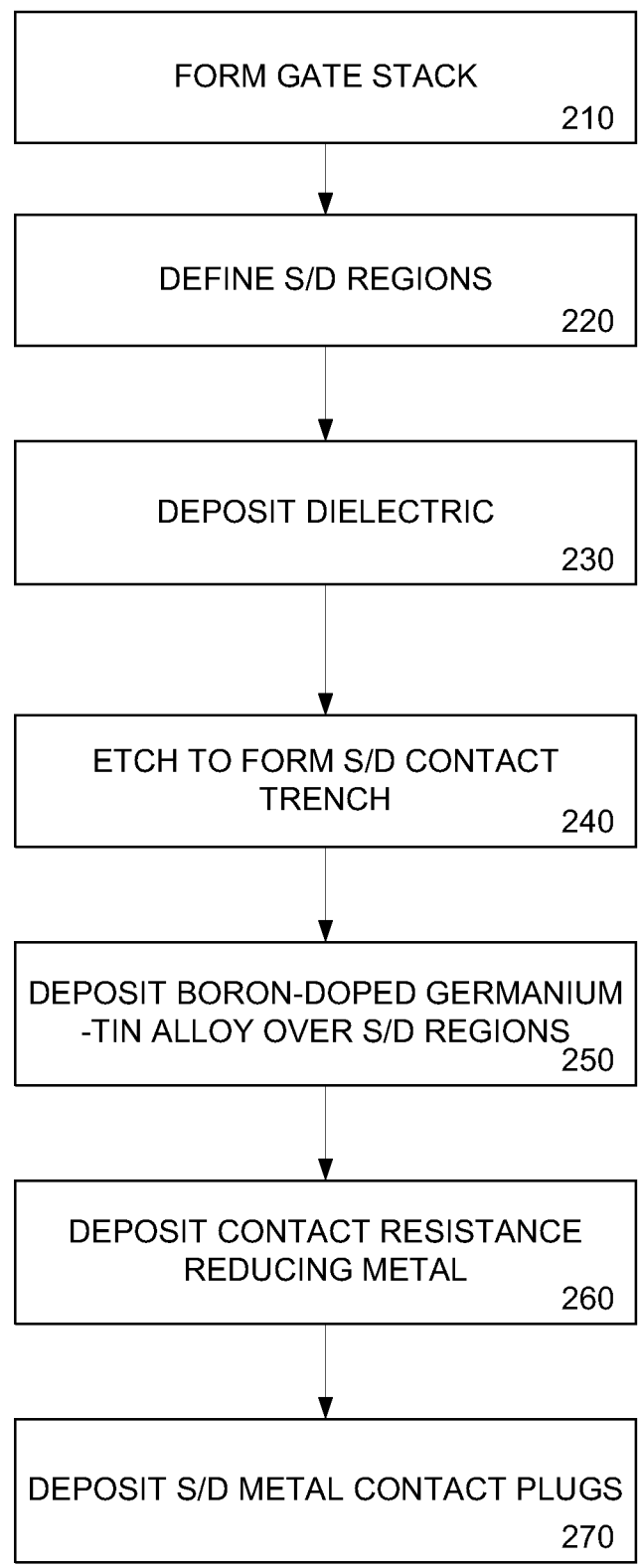
FIG. 2 is a flowchart illustrating a method of forming a MOS device having a boron-doped GeSn alloy layer between the source/drain and the source/drain contact, in accordance with an embodiment of the invention.

FIG. 2 is a method for forming a transistor structure with low contact resistance in accordance with an embodiment of the present invention. FIGS. 3A through 3I illustrate example structures that are formed as the method is carried out, and in accordance with some embodiments.

The method begins with 210 forming a gate stack on a semiconductor substrate upon which a MOS device, such as a PMOS transistor, may be formed. FIG. 3A illustrates a substrate 302 having a plurality of fins 350 over which a gate stack 304 is formed, according to an embodiment of the invention. Gate stack 304 defines a channel region 314 in fins 350. Source/drain regions 312 are disposed on opposite sides of the channel region 314, according to an embodiment. The fins 350 may be formed, for example, from a substrate that is bulk silicon or from the top layer of a substrate having a silicon-on-insulator configuration. In other implementations, the semiconductor substrate 302 may be formed using alternate materials, which may or may not be combined with silicon, such as germanium, silicon germanium, indium antimonide, lead telluride, indium arsenide, indium phosphide, gallium arsenide, or gallium antimonide. In a more general sense, any material that may serve as a foundation upon which a semiconductor device may be built can be used in accordance with embodiments of the present invention.

In an embodiment, fins 350 extend through STI regions 320. STI regions 320 may be formed using conventional techniques, such as etching the substrate 302 to form trenches, then depositing oxide material onto the trenches to form the STI regions 320. The STI regions 320 may be made from any suitable insulating material, such as $SiO_2$.

In an example embodiment, gate stack 304 is formed over three surfaces of the fin 350 to form three gates. In an embodiment, gate stack 304 includes a gate dielectric layer (which may be high-k gate dielectric material) and a sacrificial gate electrode. In another specific example case, the gate stack 304 includes a silicon dioxide gate dielectric layer and a polysilicon gate electrode. The gate stack 304 can be formed as conventionally done or using any suitable custom techniques.

Figure 3B:
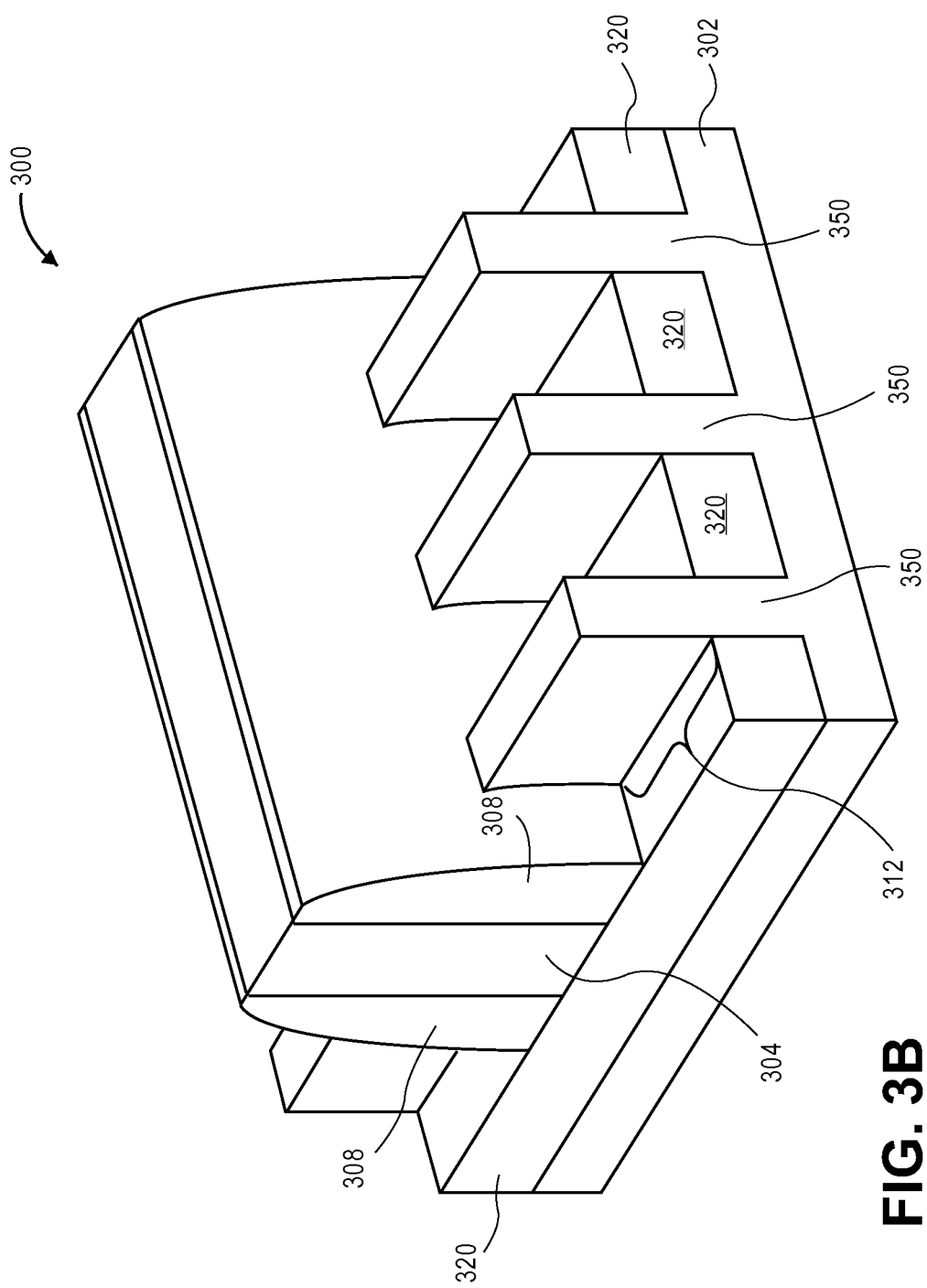
Figure 3C:
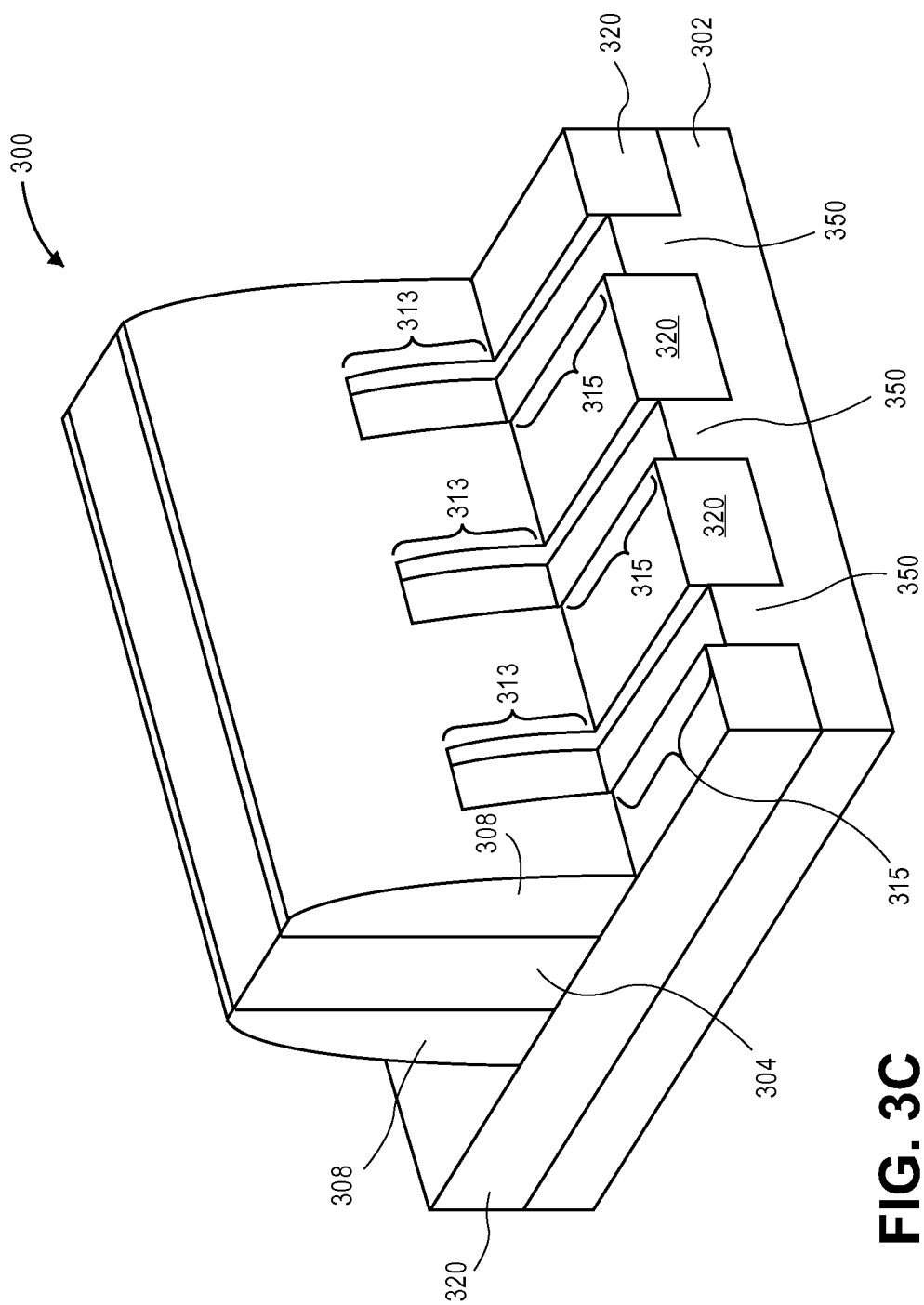

FIG. 3B illustrates spacers 308 formed on either side of the gate stack 304. The spacers 308 may be formed, for example, using conventional materials such as silicon oxide, silicon nitride, or other suitable spacer materials. The width of the spacers 308 may generally be chosen based on design requirements for the transistor being formed.

With further reference to FIG. 2, after the gate stack is formed, the method continues with 220 defining the source/drain regions of the transistor structure. As previously explained, the source/drain regions 312 can be implemented with any number of suitable processes and configurations. For example, the source/drain regions 312 may be implanted silicon, etched and epitaxially filled with SiGe. The source/drain regions 312 may be silicon, Ge or SiGe alloy. Further, source/drain regions 312 may be p-type and/or n-type. In the example embodiment shown in FIG. 3C, the source/drain portion of fins 350 have been etched below the surface of STI regions 320 to provide cavities 315 as well as respective tip areas 313 which undercut the gate spacers 308 and the gate dielectric portion of gate stack 304. It is to be appreciated that the channel portion of fin 350 has not been etched, according to an embodiment of the invention.

Figure 3D:
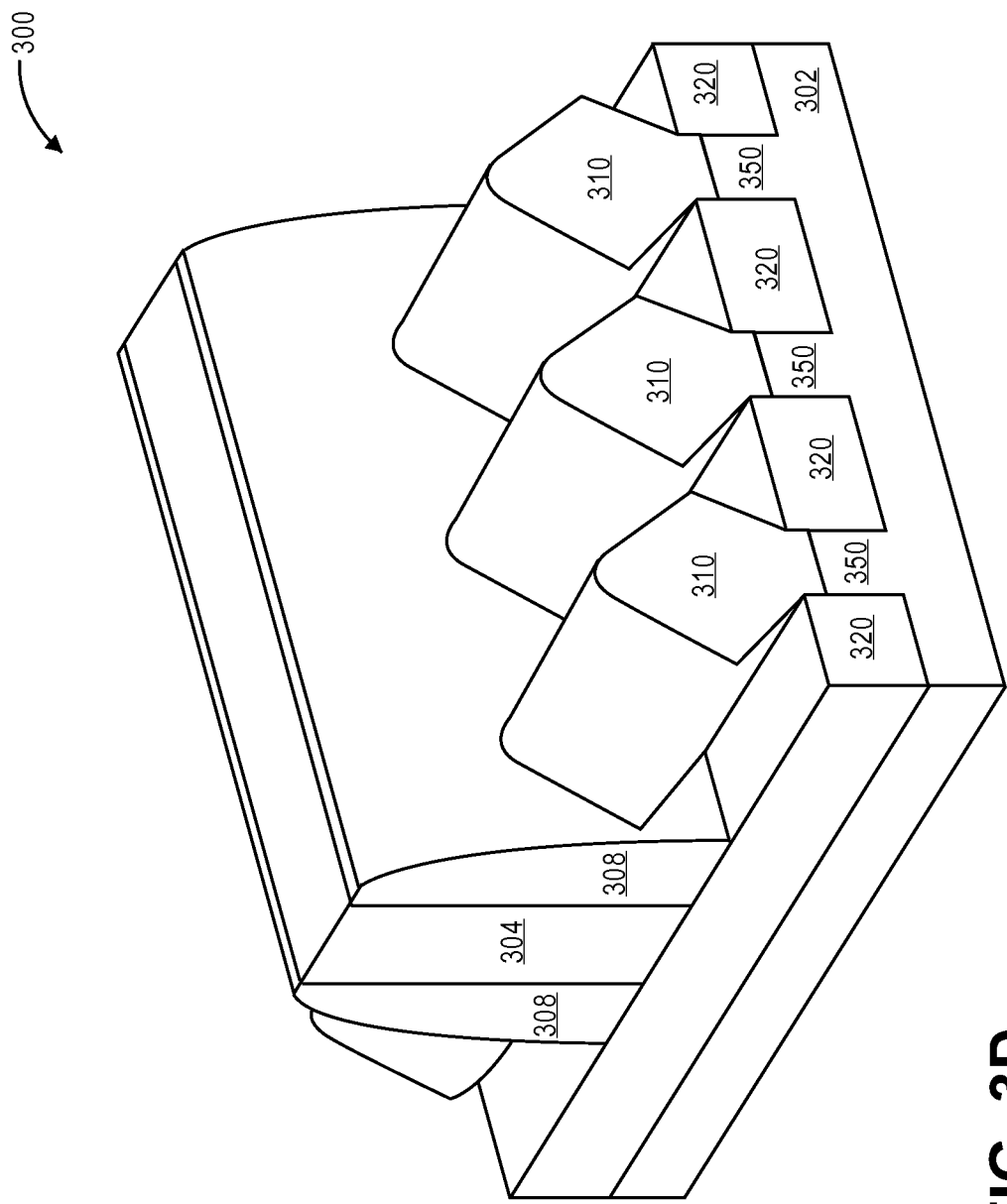

FIG. 3D illustrates device 300 after growth of epitaxial material from the top surface of the source/drain portion of each fin 350 to provide source/drain layers 310, according to an embodiment of the invention. Any number of source/drain layer configurations can be used here, with respect to materials (e.g., silicon, SiGe, III-V materials), dopant (e.g., boron in excess of $1E19$ $cm^{-3}$, or other suitable dopant/concentration), and dimension (e.g., the thickness of each source/drain layer may range, for instance, from 300 to 2500 Å, depending on the dimensions of the fins). In an embodiment, the channel region of fin 350 is silicon. In an embodiment, the growth of epitaxial material in the source/drain regions 312 creates strain in the channel portion of fin 350. In some embodiments, tip areas are not etched, but rather the fin portion extending under the gate dielectric portion of the gate structure 304 is implanted with dopants, which then diffuse into the channel region to form tip regions.

In any case, and as will be appreciated in light of this disclosure, whether a transistor structure has a strained or unstrained channel, or source-drain tip regions or no source-drain tip regions, is not particularly relevant to various embodiments of the present invention, and such embodiments are not intended to be limited to any particular such structural features. Rather, any number of transistor structures and types can benefit from employing a boron-doped germanium-tin alloy layer as described herein. The techniques provided herein are compatible, for instance, with conventional dopant implanted silicon, strained SiGe (or other suitable materials), and any deposited epitaxial tip (sometimes referred to as source-drain extensions).

Figure 3E:
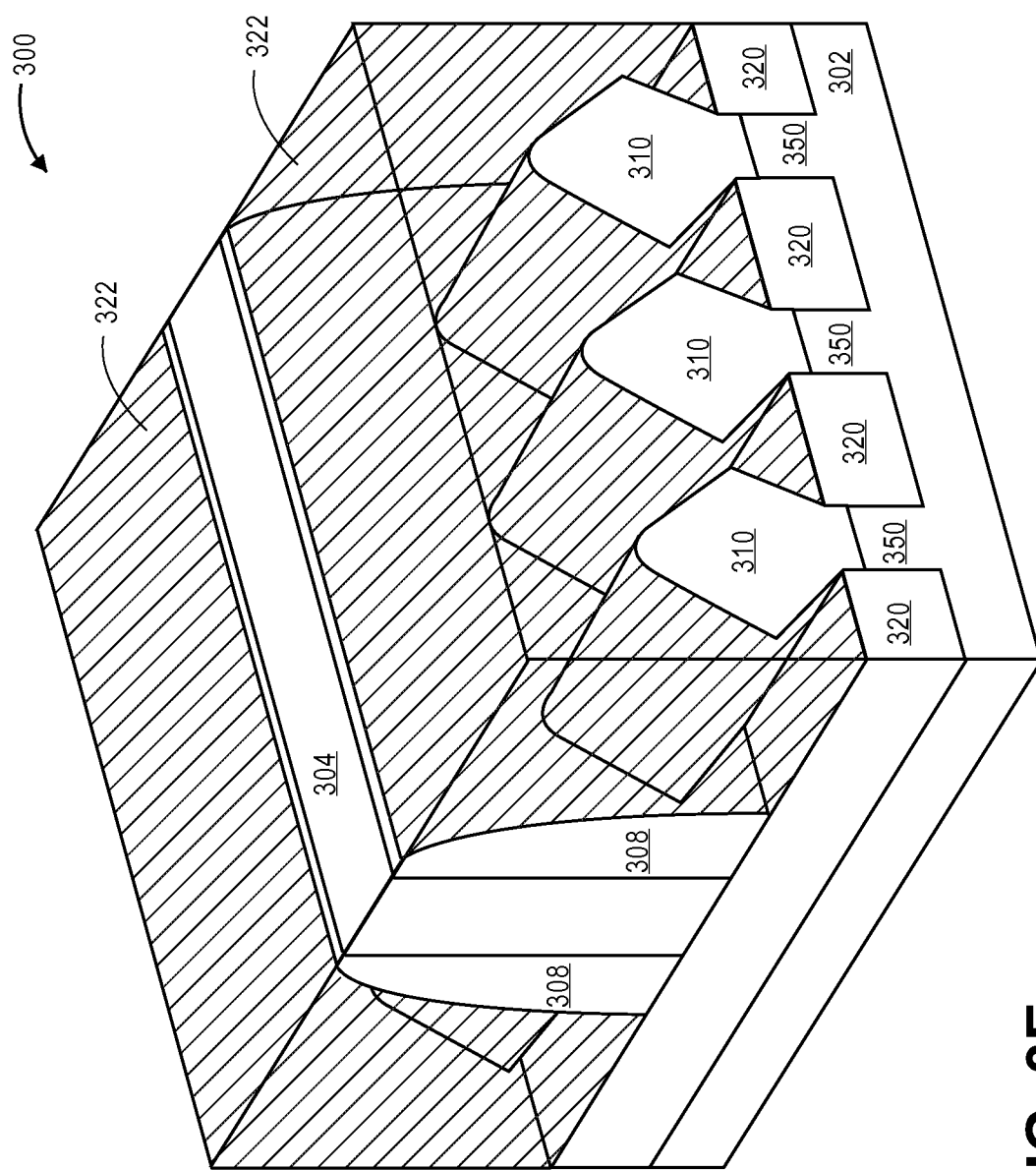

With reference to FIG. 2, after the source/drain layers are defined, the method continues with 230 blanket depositing an interlayer dielectric over the gate structure and the source drain layers, according to an embodiment of the invention. In FIG. 3E, interlayer dielectric 322 is blanket deposited over the gate structure 304 and the source/drain regions of the finFET device, then planarized with the surface of gate structure 304, according to an embodiment of the invention. The interlayer dielectric 322 can be configured in a number of ways. In some embodiments, dielectric 322 is implemented with silicon dioxide ($SiO_2$) or other low-k dielectric materials. In other embodiments, dielectric 322 is implemented with a silicon nitride (SiN) liner followed by one or more layers of $SiO_2$, or any combination of nitride, oxide, oxynitride, carbide, oxycarbide, or other suitable dielectric materials). Other example dielectric materials include, for instance, carbon doped oxide (CDO), organic polymers such as perfluorocyclobutane or polytetrafluoroethylene, fluorosilicate glass (FSG), and organosilicates such as silsesquioxane, siloxane, or organosilicate glass. In some example configurations, the ILD layer may include pores or other voids to further reduce its dielectric constant.

Next, in some embodiments of the present invention where a replacement metal gate (RMG) process is used, the method may further include removing the gate stack 304 using an etching process as conventionally done. If the gate dielectric layer is removed, the method may continue with depositing a new gate dielectric layer into the trench. Any suitable high-k dielectric materials such as those previously described may be used here, such as hafnium oxide. The same deposition processes may also be used. Replacement of the gate dielectric layer may be used, for example, to address any damage that may have occurred to the original gate dielectric layer during application of the dry and wet etch processes, and/or to replace a low-k or sacrificial dielectric material with a high-k or otherwise desired gate dielectric material. The method may further continue with depositing a metal gate electrode layer into the trench and over the gate dielectric layer. Conventional metal deposition processes may be used to form the metal gate electrode layer, such as CVD, ALD, PVD, electroless plating, or electroplating. The metal gate electrode layer may include, for example, a p-type workfunction metal, such as ruthenium, palladium, platinum, cobalt, nickel, and conductive metal oxides, e.g., ruthenium oxide. In some example configurations, two or more metal gate electrode layers may be deposited. For instance, a workfunction metal may be deposited in the gate trench followed by a suitable metal gate electrode fill metal such as aluminum or tungsten.

Figure 3F:
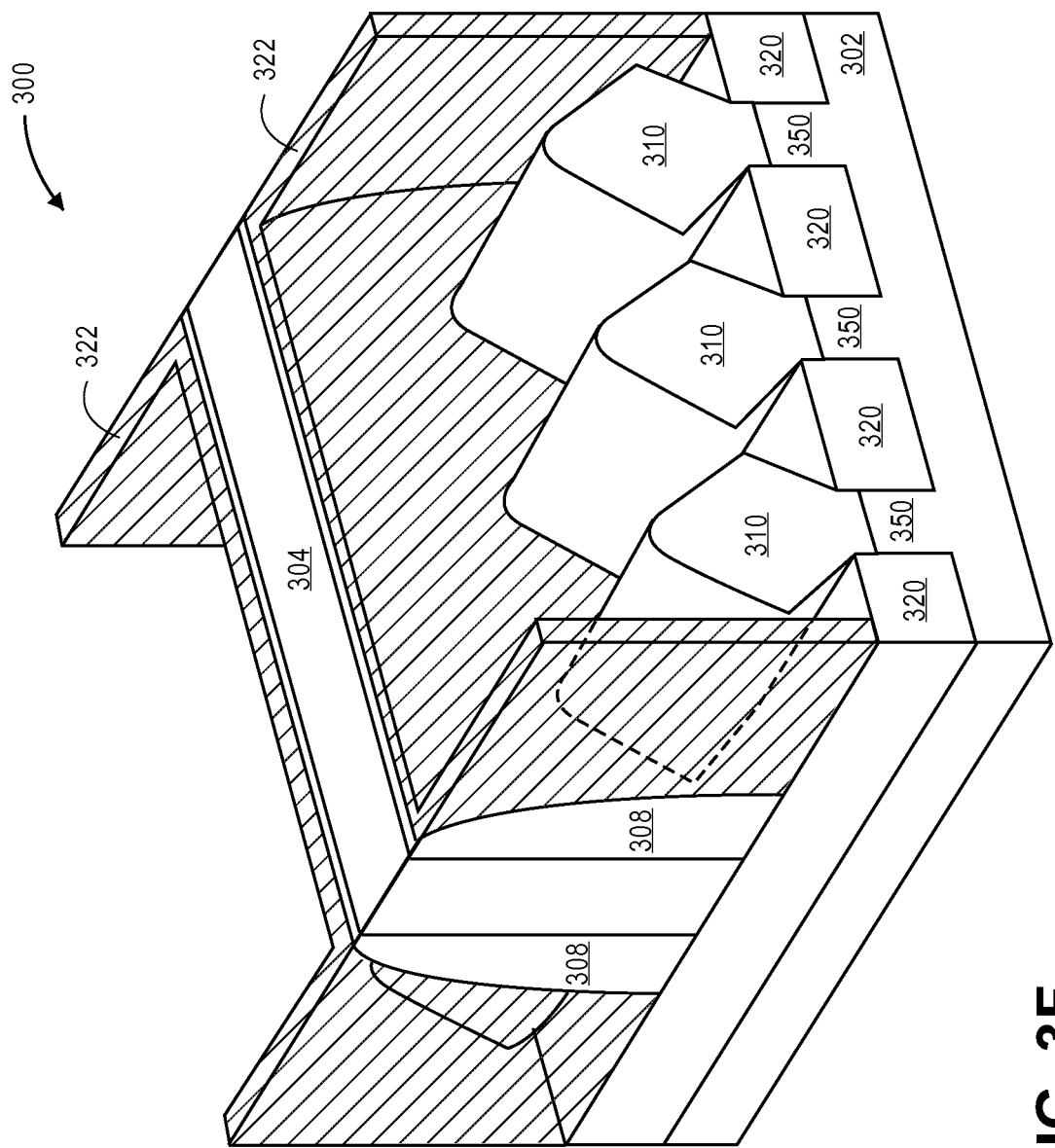

With reference to FIG. 2, after an interlayer dielectric layer is provided over the source/drain regions (and any desired RMG process), the method continues with 240 etching to form the source/drain contact trenches. Any suitable dry and/or wet etch processes can be used. FIG. 3F shows the source/drain contact trenches after etching is complete, in accordance with one example embodiment.

Figure 3G:
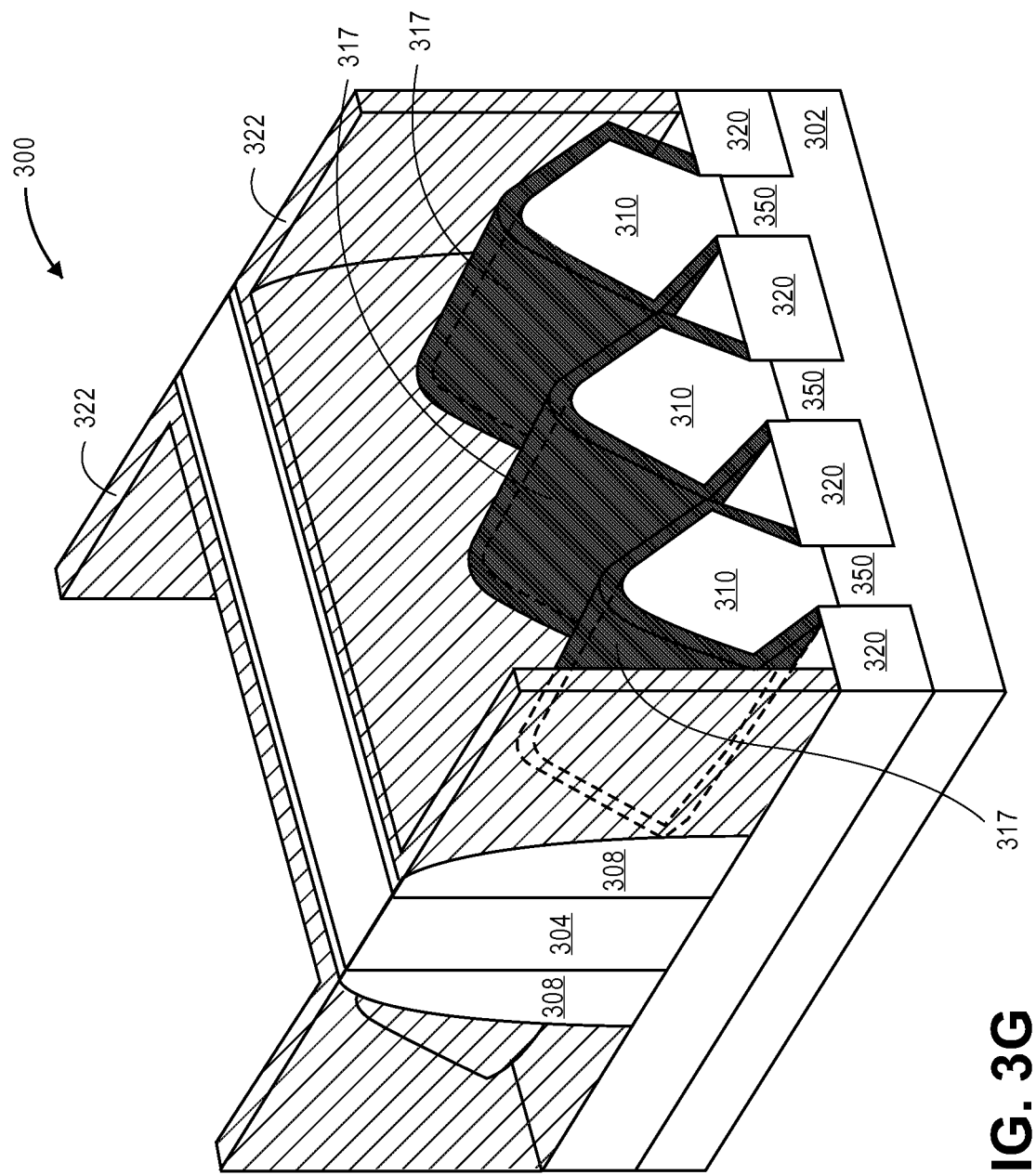

With further reference to FIG. 2, the method continues with 250 depositing a boron-doped germanium-tin alloy layer on the source/drain regions of the transistor structure. FIG. 3G shows the boron-doped germanium-tin alloy layer 317, according to an embodiment of the invention. In some example embodiments, the boron-doped germanium-tin alloy layer 317, which may be deposited in one or more layers, has a germanium concentration in excess of 70 atomic %, although other suitable concentration levels can be used as will be appreciated in light of this disclosure (e.g., in excess of 80 atomic %, or 90 atomic %, or 95 atomic %). In an embodiment, the alloy layer 317 has a tin concentration up to 30 atomic % Sn. In an embodiment, the tin concentration in alloy layer 317 is less than 15 atomic % Sn. As previously explained, this germanium concentration may be fixed or graded so as to increase from a base level (near substrate 300) to a high level (e.g., in excess of 70 atomic %), while the tin concentration may also be fixed or graded from a base level to a high level (e.g., 30 atomic %). The boron concentration in some such embodiments can be in excess of $1E19$ $cm^{-3}$, such as higher than $5E21$ $cm^{-3}$, and may also be graded so as to increase from a base level near substrate 302 to a high level (e.g., in excess of $1E19$ $cm^{-3}$, or $5E20$ $cm^{-3}$, or $5E21$ $cm^{-3}$). In addition, alloy layer 317 may contain up to 10 atomic % silicon. Preferably, GeSn alloy layer 317 contains less than 5% Si.

In embodiments where the germanium concentration of the underlying source/drain layers 310 is fixed or otherwise relatively low, a graded buffer may be used to better interface source/drain layers 310 with the boron-doped germanium-tin alloy layer 317, as previously explained. The thickness of the boron-doped germanium-tin alloy layer 317 may have a thickness in the range, for example, of 10 to 500 Å, in accordance with some specific example embodiments, although alternative embodiments may have other layer thicknesses, as will be apparent in light of this disclosure.

In some embodiments, a CVD process or other suitable deposition technique may be used for the 250 depositing or otherwise forming the boron-doped germanium-tin alloy layer 317. For example, the deposition 250 may be carried out in a CVD, or rapid thermal CVD (RT-CVD), or low pressure CVD (LP-CVD), or ultra-high vacuum CVD (UHV-CVD), or gas source molecular beam epitaxy (GS-MBE) tool using germanium-, tin-, and boron-containing precursors such as germane ($GeH_4$) or digermane ($Ge_2H_6$), tin chloride ($SnH_4$) or stannane ($SnH_4$), and diborane ($B_2H_6$) or boron difluoride ($BF_2$). In some such embodiments, there may be a carrier gas such as, for instance, hydrogen, nitrogen, or a noble gas (e.g., precursor is diluted at 1-5% concentration of carrier gas). There may also be an etchant gas such as, for example, halogen-based gas such as hydrogen chloride (HCl), chlorine (Cl), or, hydrogen bromide (HBr). The basic deposition of germanium-tin alloy and also boron-doped germanium-tin alloy is possible over a wide range of conditions using deposition temperature in the range, for example, of 300° C. to 800° C. (e.g., 300-500° C.) and reactor pressure, for instance, in the range 1 Torr to 760 Torr. Germanium is naturally selective in that it deposits on silicon or silicon-germanium alloy, and does not deposit on other materials such as silicon dioxide and silicon nitride.

Since this natural selectivity is not entirely perfect, a small flow of etchant can be used to increase the selectivity of the deposition, as previously noted. Each of the precursor and etchants can have a flow in the range of 10 and 300 SCCM (typically, no more than 100 SCCM of flow is required, but some embodiments may require higher flow rates). In one specific example embodiment, the deposition 250 is carried out using $GeH_4$ and $SnCl_4$ that is diluted in hydrogen at a 0.3% concentration and at a flow rate that ranges between 10 and 60 SCCM. For an in situ doping of boron, diluted $B_2H_6$ may be used (e.g., the $B_2H_6$ may be diluted in $H_2$ at 3% concentration and at a flow rate that ranges between 100 and 600 SCCM). In some such specific example cases, an etching agent of HCl or $Cl_2$ is added at a flow rate that ranges, for example, between 1 and 50 SCCM, to increase the selectivity of the deposition.

In an embodiment, deposition occurs on the source/drain layers by way of a trench. An advantage here is that the low melting point germanium-rich material is absent during the relatively high thermal budget steps typical in the front end of a MOS flow. After trench processing and germanium-tin alloy deposition, and in accordance with one specific such example embodiment, the structure sees no temperatures above 500° C., and therefore the germanium-tin alloy layer is not in jeopardy of melting and or otherwise becoming degraded.

As will be further appreciated in light of this disclosure, the boron-dope GeSn alloy layer 317 may be selectively deposited. For instance, while boron-doped GeSn alloy grows on p-type SiGe (or silicon) source/drain layers, it does not grow on dielectric surfaces such as silicon dioxide ($SiO_2$) or silicon nitride (SiN). In some cases, for instance, the boron-doped germanium-tin alloy layer 317 is deposited only on the source/drain layers 310 or a portion of each source/drain layer 310 (rather than across the entire structure). Any number of masking/patterning techniques can be used to selectively deposit alloy layer 317. Moreover, other embodiments may benefit from alloy layer 317 covering, for example, poly gate regions or grounding tap regions.

As will further be appreciated in light of this disclosure, the combination of high germanium concentration (e.g., in excess of 70 atomic %), substitutional tin, and high boron concentration (e.g., in excess of $1E19$ $cm^{-3}$) can be used to realize significantly lower contact resistance in the source and drain regions, in accordance with some example embodiments. The tin concentration may be adjusted to match the valence band of the alloy layer to that of the contact metal material, lowering or eliminating the barrier height at the interface of the source/drain and the source/drain contact.

Figure 3H:
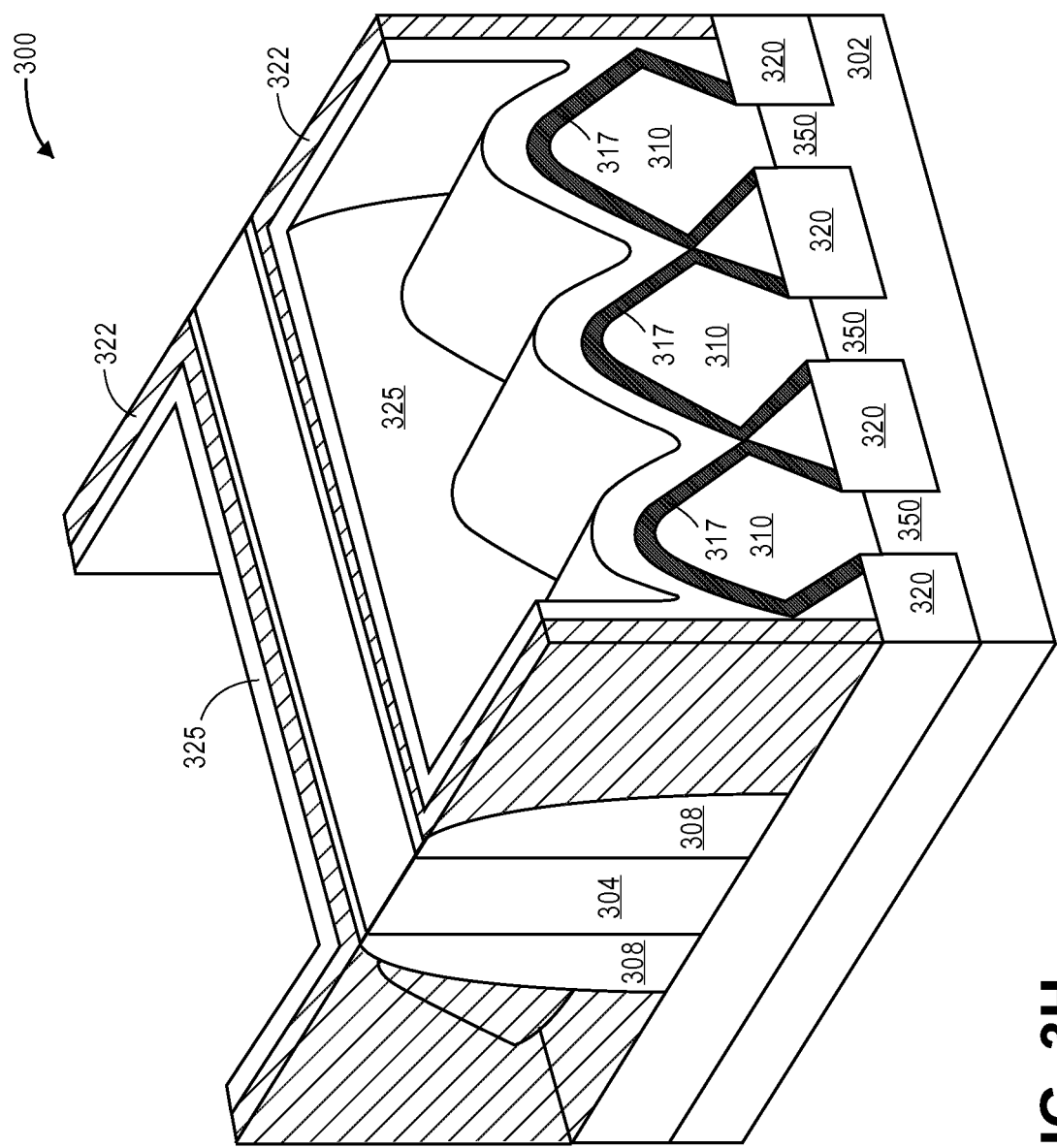
Figure 3I:
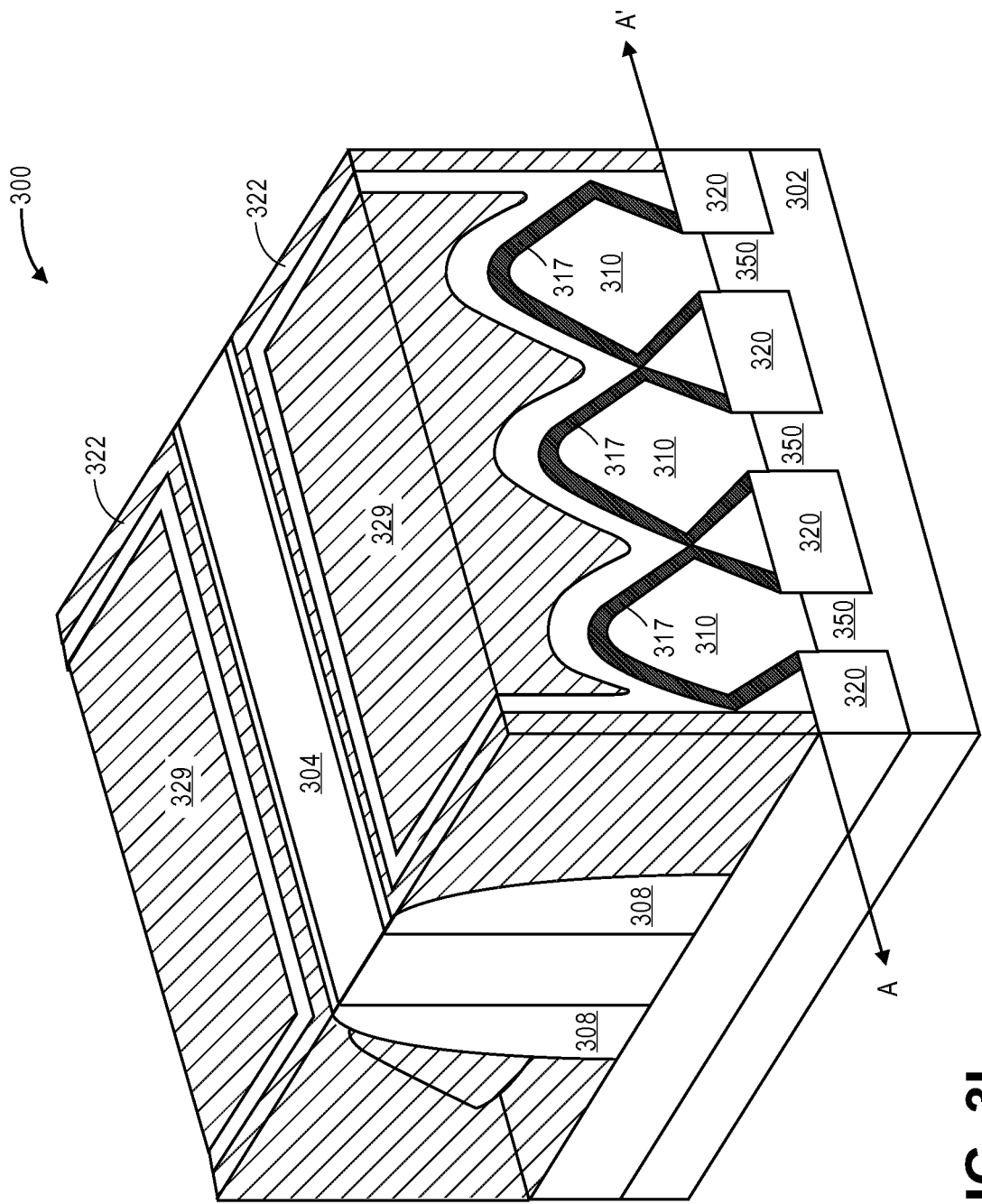

Referring to FIG. 2, the method then continues with 260 depositing a contact resistance reducing metal. FIG. 3H shows the contact metal 325, according to an embodiment of the invention. Contact metal 325 may be Ti, Pt, Ni, Co, or other suitable contact metals. Contact metal 325 may be deposited by conventional deposition processes.

In an embodiment, contact metal layer 325 includes a silicide/germanide, although other embodiments may include additional layers (e.g., an adhesion layer), according to an embodiment of the invention. The germanide/metalization of the source/drain contacts can be carried out, for instance, by silicidation with nickel, aluminum, nickel-platinum or nickel-aluminum or other alloys of nickel and aluminum, or titanium with or without germanium pre-amorphization implants to form a low resistance germanide. In an embodiment, the source/drain contact is annealed to enable formation of the silicide/germanide layer. In another embodiment, the boron-doped germanium-tin alloy layer 317 allows for metal-germanide formation (e.g., nickel-germanium) during subsequent backend processing steps, and no separate germanide/metallization step is necessary. The germanide allows for significantly lower Schottky-barrier height and improved contact resistance (including $R_{ext}$) over that in conventional metal-silicide systems.

Next, as shown in FIG. 2, the source/drain contact plugs are 270 deposited over the contact metal. FIG. 3I shows the contact plug metal 329, which in some embodiments includes tungsten, although any suitably conductive contact metal or alloy can be used for the contact plug 329, such as aluminum, silver, nickel-platinum or nickel-aluminum or other alloys of nickel and aluminum, or titanium, using conventional deposition processes. FIG. 1A is a cross sectional view of the structure illustrated in FIG. 3I, taken through the source/drain region along line A-A'.

As such, an example embodiment of a structure for a finFET transistor configured with a boron-doped germanium-tin alloy layer between the source/drain and the source/drain contact for improved contact resistance is provided, along with an example embodiment of a method for forming such structure is provided. Conventional transistors typically use a source/drain SiGe epi process, with germanium concentration in the range of 30-40 atomic %. Such conventional systems exhibit $R_{ext}$ values of about 140 Ohm*um, limited by epi/silicide interfacial resistance, which is high and may impede future gate pitch scaling. Some embodiments of the present invention allow for a significant improvement in $R_{ext}$ in PMOS devices (e.g., about a 2-5× improvement or better, such as a $R_{ext}$ of about 60 Ohm*um), which can better support PMOS device scaling. As, transistors having a source/drain configured with boron-doped germanium-tin alloy layer 317 in accordance with an embodiment of the present invention, with a boron concentration in excess of 1E19 $cm^{-3}$, a germanium concentration in excess of 70 atomic % and a tin concentration of 30 atomic % or less at the interface between the source/drain layers 310 and the contact metals 325, can exhibit $R_{ext}$ values of less than 90 Ohm*um, and in some cases less than 80 Ohm*um, and in some cases less than 70 Ohm*um, and in some cases less than 60 Ohm*um, or lower.

Figure 4A:
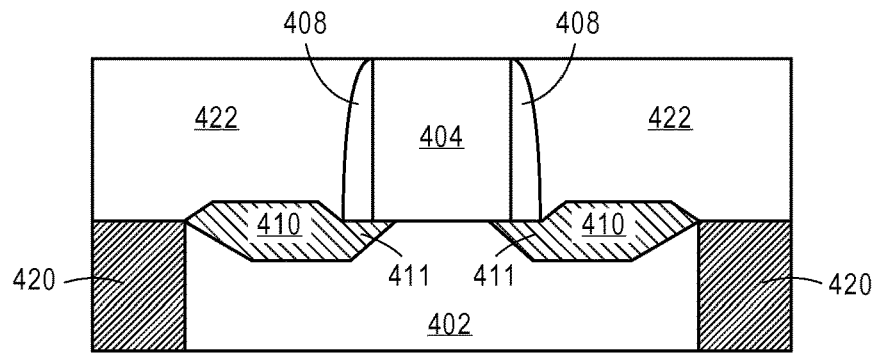
FIGS. 4A-4D illustrate cross-sectional views of a method for forming a planar MOS device having a boron-doped GeSn alloy layer between the source/drain and the source/drain contact, in accordance with an embodiment of the invention.

FIGS. 4A-4D illustrate a method for forming a transistor having a planar architecture with a boron-doped germanium-tin alloy layer between the source/drain and source/drain contact, according to an embodiment of the invention. In general, the planar method is similar to the method described with reference to FIG. 2 and the finFET structure in FIGS. 3A-H. Referring to FIG. 4A, in an embodiment a gate structure 404 is provided over a substrate 402, defining a channel region within the substrate. In an embodiment, a pair of source/drain regions are formed on opposite sides of the gate structure 404. Source/drain regions may be formed by implanting dopants directly into substrate 402, or by etching a portion of the substrate to deposit source/drain layers 410, as shown in FIG. 4A and described above with respect to source/drain layers 310. Source/drain regions 410 may be formed from appropriate semiconductor materials, such as SiGe or doped Si for a p-type device. Source/drain regions 410 may have tip regions 411 extending under the gate sidewall spacers 408. In an embodiment, STI regions 420 isolate the active regions of the device. In an embodiment, interlayer dielectric 422 is formed over the surface and planarized with the gate structure 404.

Figure 4B:
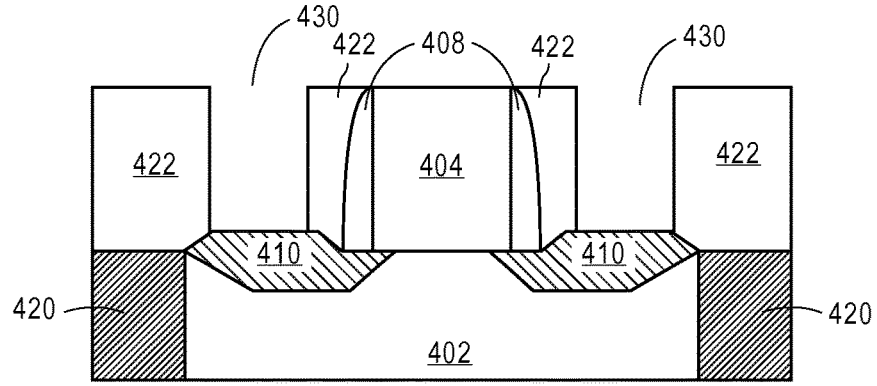
Figure 4C:
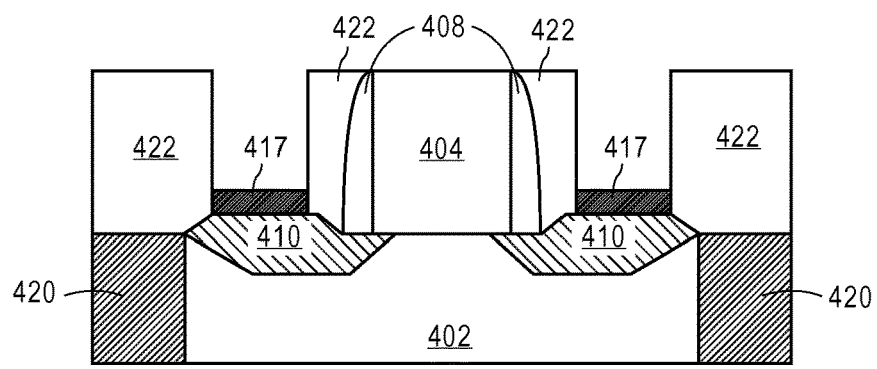

In FIG. 4B, contact trenches 430 are etched in interlayer dielectric 422 to expose source/drain layers 410, according to an embodiment of the invention. In an embodiment, boron-doped germanium-tin alloy layer 417 is formed in the trench 430 over source/drain contact layer 410, as shown in FIG. 4C. In example planar embodiments, boron-doped germanium-tin alloy layer is from 10 to 500 Å thick. The composition of boron-doped germanium-tin alloy layer 417 is as discussed above with respect to alloy layer 317. In an embodiment, boron-doped germanium-tin alloy layer 417 is selectively deposited on p-type source/drain regions. Boron-doped germanium-tin alloy layer 417 may be formed by any appropriate method, such as MBE or CVD. In another embodiment, boron-doped germanium-tin alloy layer 417 is formed over the top surface of source/drain contact layer 410 prior to the blanket deposition of interlayer dielectric 422. The contact trenches 430 may be etched in interlayer dielectric 422 to expose the top surface of boron-doped germanium-tin alloy layer 417 prior to the formation of source/drain contacts within the trenches.

Figure 4D:
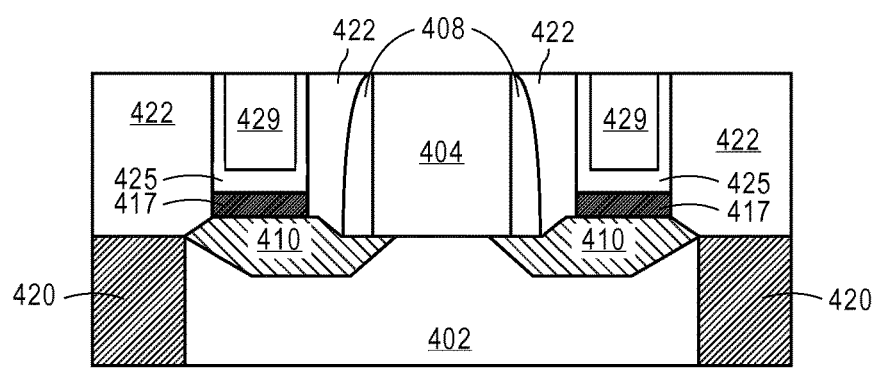

Next, as shown in FIG. 4D, a source/drain contact stack is formed within the trench 430. In an embodiment, the source/drain contact stack comprises contact metal 425 on boron-doped germanium-tin alloy layer 417, an adhesion layer on contact metal 425 (not shown), and a metal contact plug 429, each deposited by conventional methods. After deposition of contact metal 425, the device may optionally be annealed to form a metal germanide at the interface of boron-doped germanium-tin alloy layer and metal contact layer 425. The materials comprising the source/drain contact stack are as described above with respect to FIGS. 3H-I.

FIGS. 5A-5D illustrate isometric views of an alternative method for incorporating a boron-doped germanium-tin alloy layer between the source/drain and source/drain contact of a nanowire-based FET. In general, this method is similar to the method described with reference to FIGS. 2 and 3A-H.

Figure 5A:
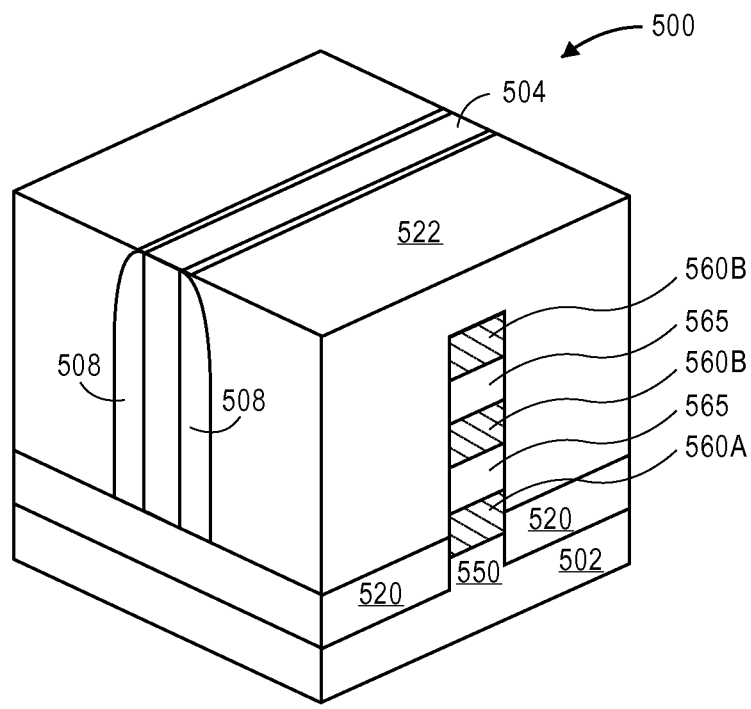
FIGS. 5A-5D illustrate isometric views of a method for forming a nanowire-based MOS device having a boron-doped GeSn alloy layer between the source/drain and the source/drain contact, in accordance with an embodiment of the invention.

Referring to FIG. 5A, structure 500 comprises a nanowire stack containing a plurality of nanowires 560A/560B separated by sacrificial material 565 is disposed above a substrate 502, according to an embodiment of the invention. In an embodiment, bottommost nanowire 560A is formed on fin 550 extending through STI region 520. In an embodiment, gate structure 504 is formed over the nanowire stack, defining a channel region of the transistor 500 within nanowires 560A/560B. In an embodiment, gate structure 504 is a functional gate, comprising a gate dielectric layer wrapping around the full perimeter of the channel region of each nanowire 560A/560B and a gate electrode formed over the gate dielectric and wrapping around nanowires 560A/560B. In another embodiment, gate structure 504 may be a dummy gate structure, comprising, for example, a poly gate and a dummy gate dielectric, to be replaced with a functional gate in an RMG process. In an embodiment, gate sidewall spacers 508 are formed on the sidewalls of gate structure 504. In an embodiment, interlayer dielectric 522 covers the source/drain regions of the nanowire stack.

Figure 5B:
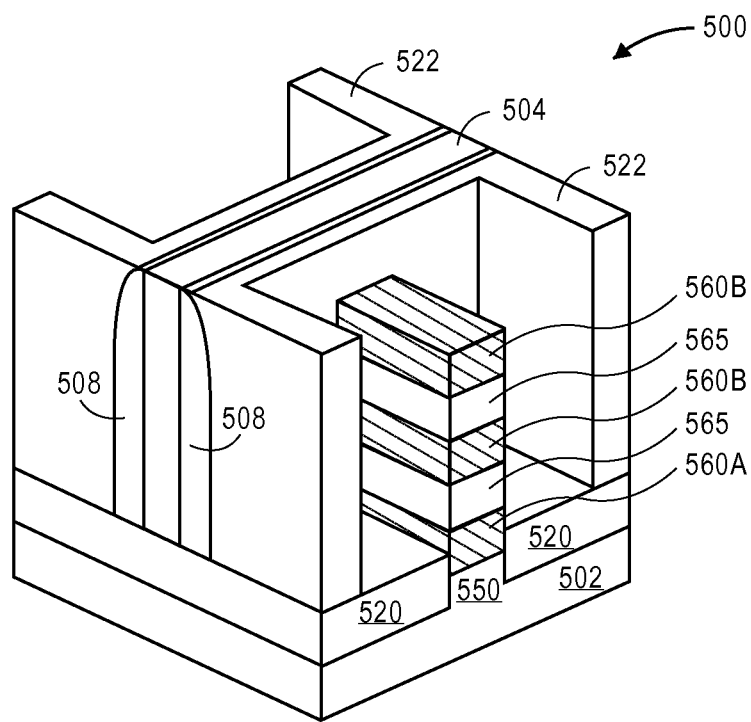

In FIG. 5B, interlayer dielectric 522 and sacrificial material 565 have been etched to expose the full perimeter of the source/drain portions of top nanowires 560B and a portion of the perimeter of bottommost nanowire 560A, according to an embodiment of the invention. In an embodiment, the interlayer dielectric 522 is first removed to expose the source/drain portion of the nanowire stack. Interlayer dielectric 522 may be removed using a conventional etching method such a plasma dry etch or a wet etch. Next, the sacrificial material 565 is removed to expose the full perimeter of each nanowire 560A/560B, according to an embodiment. The removal of sacrificial material 565 leaves a void between adjacent nanowires 560A/560B. Sacrificial material 565 may be removed using any known etchant that is selective to nanowires 560A/560B. In an embodiment where nanowires 560A/560B are silicon and sacrificial material 565 is silicon germanium, sacrificial material 565 is selectively removed using a wet etchant such as, but not limited to, aqueous carboxylic acid/nitric acid/HF solution and aqueous citric acid/nitric acid/HF solution. In an embodiment where nanowires 560A/560B are germanium and sacrificial material 565 is silicon germanium, sacrificial material 565 is selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution.

Figure 5C:
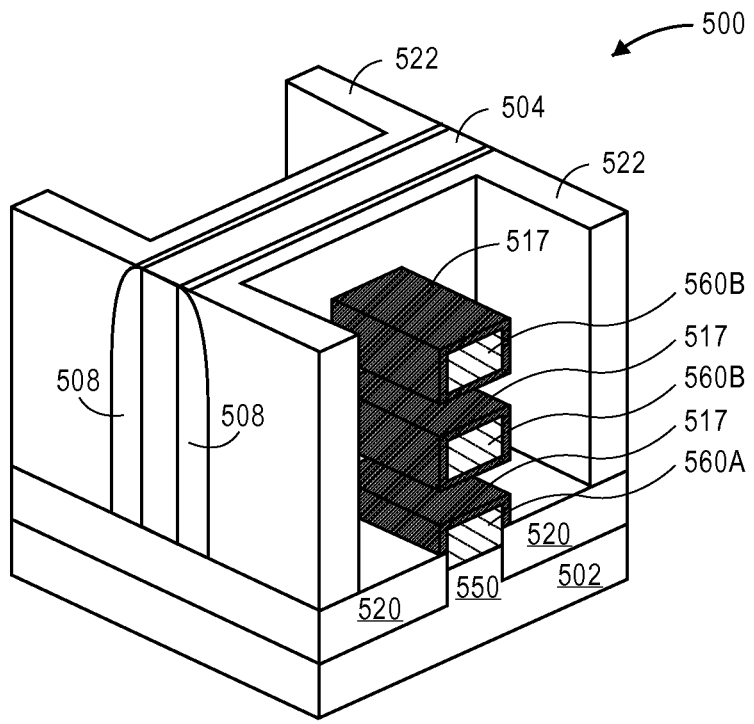
Figure 5D:
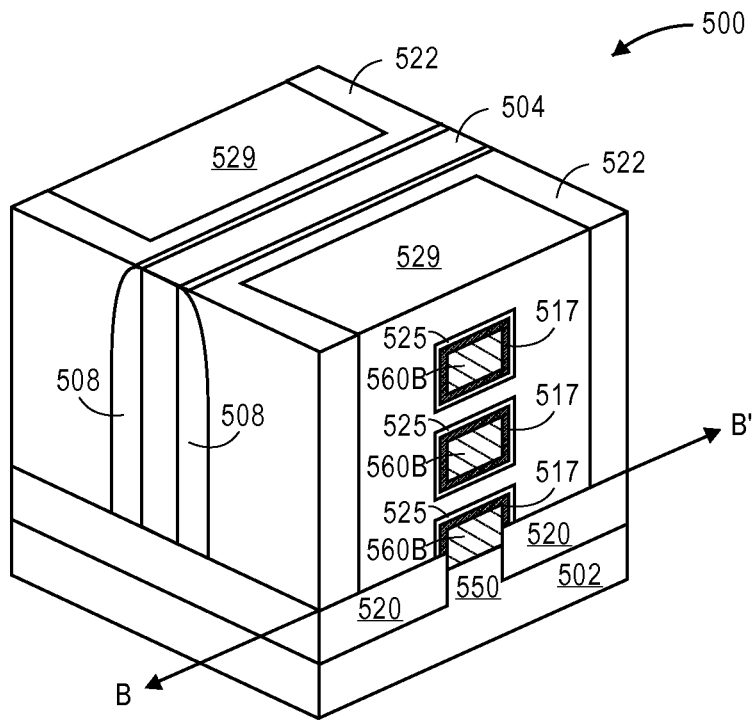

In an embodiment, boron-doped germanium tin-layer 517 is formed on the exposed source/drain surfaces of nanowires 560A/560B, as shown in FIG. 5C. The composition of boron-doped germanium-tin alloy layer 517 is as discussed above with respect to alloy layer 317. Alloy layer 517 may be formed by an appropriate conformal deposition method to ensure deposition around the full perimeter of top nanowires 560B. In example planar embodiments, boron-doped germanium-tin alloy layer is from 10 to 500 Å thick.

Next, in FIG. 5D, the contact stack is formed, according to an embodiment of the invention. In an embodiment, a contact metal layer 525 is deposited over boron-doped germanium-tin alloy layer 517. The structure may optionally be annealed to form a germanide at the interface of layers 525 and 517. An adhesion layer may optionally be formed over the metal contact layer 525. In an embodiment, the contact trench is then filled with contact plug 529, wherein the plug metal fills the spaces between material layers formed on nanowires 560A/560B. The contact metal 525, adhesion layer, and contact plug 529 may be deposited by any appropriate conformal method to achieve a wrap-around contact structure.

In another embodiment, the source/drain portion of nanowires 560A/560B is removed by etching, and a semiconductor material is epitaxially grown to form homogenous source/drain layers. In such a case, the boron-doped germanium-tin alloy layer may be deposited over the top surface of homogenous source/drain layer, followed by the formation of source/drain contacts.

Figure 6:
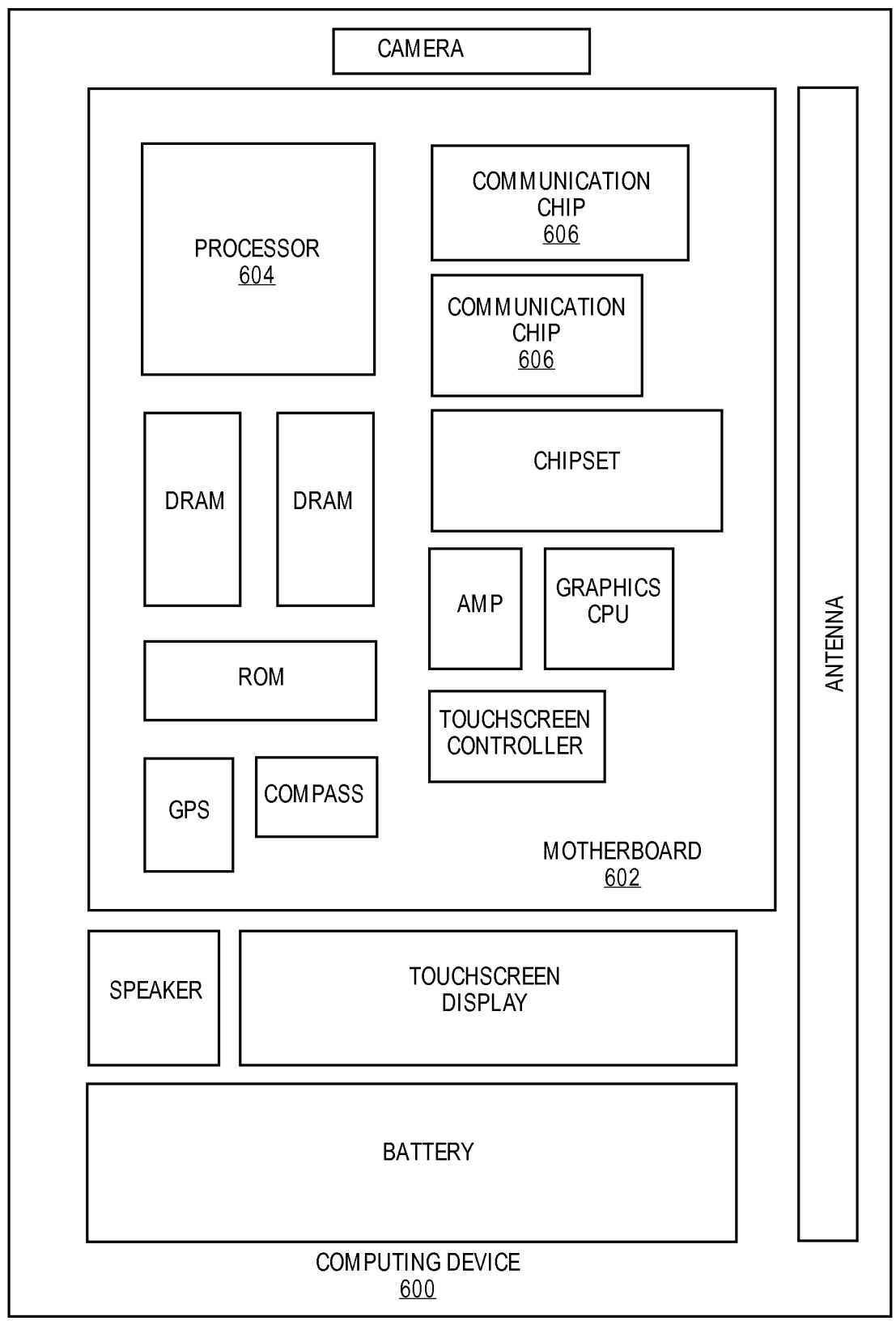
FIG. 6 illustrates a computing system implemented with one or more transistor structures in accordance with an example embodiment of the present invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes a boron-doped Ge—Sn alloy layer disposed between the source/drain region and the source/drain contact, in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes a boron-doped Ge—Sn alloy layer disposed between the source/drain region and the source/drain contact, in accordance with implementations of the invention.

In further implementations, another component housed within the computing device 600 may contain an integrated circuit die that includes a boron-doped Ge—Sn alloy layer disposed between the source/drain region and the source/drain contact, in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

In an embodiment, a transistor device comprises a semiconductor body; a gate defining a channel region within the semiconductor body; a pair of source/drain regions on opposite sides of the channel region; and a Ge—Sn alloy layer on at least one of the source region/drain regions, wherein the Ge—Sn alloy layer comprises a germanium concentration in excess of 70 atomic %, a tin concentration less than 30 atomic %, and a p-type dopant concentration in excess of 1E19 cm$^{-3}$. The tin concentration may be from 1-15 atomic % or from 3-10 atomic %. The device may be a planar transistor, a finFET, or a nanowire transistor. The Ge—Sn alloy layer may be polycrystalline. The p-type dopant may be boron. A contact metal may contact the Ge—Sn alloy layer. The contact metal may be a metal germanide. In an embodiment, the Ge—Sn alloy layer comprises less than 10% Si. In an embodiment, the Ge—Sn alloy layer comprises less than 5% Si. The transistor device may further comprise a graded buffer layer between the source/drain region and the Ge—Sn alloy layer. The graded buffer layer may have a Ge concentration that is graded from a base level concentration compatible with the source/drain region to a high concentration in excess of 95 atomic %. The graded buffer layer may have a Sn concentration that is graded from a base level concentration compatible with the source/drain region to a high concentration less than 30 atomic %. The graded buffer layer may have a boron concentration that is graded from a base level concentration compatible with the source and drain regions to a high concentration in excess of $1E19$ $cm^{-3}$. The semiconductor body may have a silicon concentration in excess of 10 atomic %.

In an embodiment, a transistor device, comprises a gate defining a channel region within a silicon body; a pair of silicon germanium source/drain regions on opposite sides of the channel region; a Ge—Sn alloy layer on at least one of the source region/drain regions, wherein the Ge—Sn alloy layer comprises a germanium concentration in excess of 75 atomic %, a tin concentration less than 15 atomic %, and a boron concentration in excess of $1E19$ $cm^{-3}$; and a contact metal layer on the Ge—Sn alloy layer. In an embodiment, the contact metal layer comprises a metal selected from the group consisting of Ti, Pt, Ni, and Co. In an embodiment, the contact metal layer further comprises a metal silicide. In an embodiment, the contact metal layer further comprises a metal germanide. In an embodiment, the method further comprises a graded buffer layer between the source/drain region and the Ge—Sn alloy layer. In an embodiment, the Ge—Sn alloy layer comprises less than 5% Si.

In an embodiment, a method comprises forming a gate stack defining a channel region of a semiconductor device and a pair of source/drain regions on opposite sides of the channel region; blanket depositing a dielectric material over the semiconductor device; etching a trench in the dielectric material to expose at least a portion of at least one of the source/drain regions; and forming a Ge—Sn alloy layer within the trench on the source/drain region, wherein the Ge—Sn alloy layer comprises a germanium concentration in excess of 70 atomic %, a tin concentration less than 30 atomic %, and a p-type dopant concentration in excess of $1E19$ $cm^{-3}$. The method may further comprise depositing a contact metal layer over the Ge—Sn contact layer. The method may further comprise annealing to form a metal germanide contact metal layer. The method may further comprise depositing contact plug over the contact metal layer. The method may further comprise forming a graded buffer layer over the source/drain region. The Ge—Sn alloy layer may be formed by selective deposition/molecular beam epitaxy or by chemical vapor deposition.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the boron-doped germanium-tin alloy layer and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A transistor device, comprising:
a semiconductor body above a top surface of a substrate;
a gate defining a channel region within the semiconductor body;
a pair of source/drain regions on opposite sides of the channel region; and
a Ge—Sn alloy layer comprising germanium, tin and boron on at least one of the source/drain regions, wherein a portion of the Ge—Sn alloy layer is above the at least one of the source/drain regions;
and a contact metal layer on the Ge—Sn alloy layer, the Ge—Sn alloy layer comprising a first interface region that is in direct contact with the at least one of the source/drain regions and a second interface region that is in direct contact with the contact metal layer, wherein the concentration of boron is graded in a direction normal to the top surface of the substrate within the portion of the Ge—Sn alloy layer and outside of the gate from a base level concentration of less than $1E19$ $cm^{-3}$ at the first interface to a concentration greater than $1E19$ $cm^{-3}$, the concentration of Ge is greater than 70 atomic %, and the concentration of tin gradually increases from a base level in the first interface region to a predetermined level in the second interface region to reduce a contact resistance between the at least one of the source/drain regions and the contact metal layer.

2. The transistor device of claim 1, wherein the base level of the tin concentration is 1 atomic % and the predetermined level of the tin concentration is 15 atomic %.

3. The transistor device of claim 1, wherein the base level of the tin concentration is 3 atomic % and the predetermined level of the tin concentration is 10 atomic %.

4. The transistor device of claim 1, wherein the semiconductor body comprises a fin; and wherein the Ge—Sn alloy layer is deposited on at least two sides of the fin.

5. The transistor device of claim 1, wherein the Ge—Sn alloy layer is polycrystalline.

6. The transistor device of claim 1, wherein the contact metal comprises a metal germanide.

7. The transistor device of claim 1, wherein the Ge—Sn alloy layer comprises less than 10% Si.

8. The transistor device of claim 1, wherein the Ge—Sn alloy layer comprises less than 5% Si.

9. The transistor device of claim 1, further comprising a graded buffer layer having a graded Ge concentration between the at least one source/drain region and the Ge—Sn alloy layer.

10. The transistor device of claim 9, wherein the graded Ge concentration is from a base level concentration compatible with the source/drain region to a high concentration in excess of 90 atomic %.

11. The transistor device of claim 1, wherein the predetermined level of the tin concentration is 30 atomic %, and the base level of the tin concentration is less than 30 atomic %.

12. The transistor device of claim 9, wherein the graded buffer layer has a boron concentration that increases from a base level concentration compatible with the source and drain regions to a high concentration in excess of 1E19 cm'.

13. The transistor device of claim 1, wherein the semiconductor body has a silicon concentration in excess of 10 atomic %.

14. A transistor device, comprising:
a gate defining a channel region within a silicon body, the silicon body above a top surface of a substrate;
a pair of silicon germanium source/drain regions on opposite sides of the channel region;
a Ge—Sn alloy layer comprising germanium, tin and boron on at least one of the source/drain regions, wherein a portion of the Ge—Sn alloy layer is above the at least one of the source/drain regions; and
a contact metal layer on the Ge—Sn alloy layer, the Ge—Sn alloy layer comprising a first interface region that is in direct contact with the at least one of the source/drain regions and a second interface region that is in direct contact with the contact metal layer, wherein the concentration of boron is graded in a direction normal to the top surface of the substrate within the portion of the Ge—Sn alloy layer and outside of the gate from a base level concentration of less than 1E19 cm$^{-3}$ at the first interface to a concentration greater than 1E19 cm$^{-3}$, the concentration of germanium is greater than 75 atomic %, the concentration of tin gradually increases from a base level in the first interface region to 15 atomic % in the second interface region to reduce a contact resistance between the at least one of the source/drain regions and the contact metal layer.

15. The transistor device of claim 14, wherein the contact metal layer comprises a metal selected from the group consisting of Ti, Pt, Ni, and Co.

16. The transistor device of claim 15, wherein the contact metal layer further comprises a metal silicide.

17. The transistor device of claim 15, wherein the contact metal layer further comprises a metal germanide.

18. The transistor device of claim 14, further comprising a graded buffer layer between the at least one of the source/drain regions and the Ge—Sn alloy layer.

19. The transistor device of claim 14, wherein the Ge—Sn alloy layer comprises less than 5% Si.

20. A method, comprising:
forming a gate stack defining a channel region of a semiconductor device and a pair of source/drain regions on opposite sides of the channel region, the channel region above a top surface of a substrate;
blanket depositing a dielectric material over the semiconductor device;
etching a trench in the dielectric material to expose at least a portion of at least one of the source/drain regions; and
forming a Ge—Sn alloy layer comprising germanium, tin and boron within the trench on at least the portion of the at least one of the source/drain regions, wherein a portion of the Ge—Sn alloy layer is above the at least one of the source/drain regions,
depositing a contact metal layer on the Ge—Sn alloy layer, the Ge—Sn alloy layer comprising a first interface region that is in direct contact with the at least one of the source/drain regions and a second interface region that is in direct contact with the contact metal layer, wherein the concentration of boron is graded in a direction normal to the top surface of the substrate within the portion of the Ge—Sn alloy layer and outside of the gate from a base level concentration of less than 1E19 cm$^{-3}$ at the first interface to a concentration greater than 1E19 cm$^{-3}$, the concentration of germanium is greater than 70 atomic %, and the concentration of tin gradually increases from a base level in the first interface region to a predetermined level in the second interface region to reduce a contact resistance between the at least one of the source/drain regions and the contact metal layer.

21. The method of claim 20, further comprising depositing a contact plug over the contact metal layer.

22. The method of claim 20, further comprising forming a graded buffer layer on the at least one of the source/drain regions.

23. The method of claim 20, wherein the Ge—Sn alloy layer is formed by at least one of a selective deposition, or a molecular beam epitaxy.

24. The method of claim 20, wherein the Ge—Sn alloy layer is formed by a chemical vapor deposition.

* * * * *